(12) United States Patent
Minami et al.

(10) Patent No.: US 12,392,804 B2
(45) Date of Patent: Aug. 19, 2025

(54) CURRENT DETECTION APPARATUS

(71) Applicants: Yokogawa Electric Corporation, Musashino (JP); Yokogawa Test & Measurement Corporation, Hachioji (JP)

(72) Inventors: Hiroki Minami, Hachioji (JP); Hiroyuki Ishida, Hachioji (JP); Kazuki Sakamoto, Hachioji (JP); Tomoaki Yoshihara, Hachioji (JP)

(73) Assignees: YOKOGAWA ELECTRIC CORPORATION, Tokyo (JP); YOKOGAWA TEST & MEASUREMENT CORPORATION, Tokyo (JP)

( * ) Notice: Subject to any disclaimer, the term of this patent is extended or adjusted under 35 U.S.C. 154(b) by 156 days.

(21) Appl. No.: 18/219,343

(22) Filed: Jul. 7, 2023

(65) Prior Publication Data
US 2024/0012031 A1    Jan. 11, 2024

(30) Foreign Application Priority Data
Jul. 11, 2022 (JP) .................................. 2022-111445

(51) Int. Cl.
G01R 15/18    (2006.01)
(52) U.S. Cl.
CPC .................................. G01R 15/185 (2013.01)
(58) Field of Classification Search
CPC ... G01R 15/185; G01R 15/14; G01R 19/0092
See application file for complete search history.

(56) References Cited

U.S. PATENT DOCUMENTS 7,253,634 B1 *   8/2007  Kasztenny ............... H02H 7/06
                                                         324/509
9,634,605 B2 *   4/2017  Masuda .................... H02P 6/28
(Continued)

FOREIGN PATENT DOCUMENTS

GB          499239 A      1/1939
GB          522276 A      6/1940
(Continued)

OTHER PUBLICATIONS

Office Action dated Feb. 12, 2024, issued in counterpart JP application No. 2022-111445, with English translation. (8 pages).
(Continued)

*Primary Examiner* — Lee E Rodak
*Assistant Examiner* — Zannatul Ferdous
(74) *Attorney, Agent, or Firm* — WHDA, LLP

(57) ABSTRACT

A current detection apparatus (10) according to the present disclosure includes an annular magnetic core (13), a first coil group (14) including a plurality of first coils (La) connected in series, a second coil group (15) including a plurality of second coils (Lb) connected in series, and a detector (12). The first coil group (14) and the second coil group (15) are connected in parallel between a first node (21) and a second node (22), a count of the plurality of first coils (La) and a count of the plurality of second coils (Lb) are identical, and a first coil (La), among the plurality of first coils (La), in $i^{th}$ place from the first node (21) and a second coil (Lb), among the plurality of second coils (Lb), in $i^{th}$ place from the first node (21) are arranged at opposing positions, where i is an integer.

8 Claims, 5 Drawing Sheets

(56) References Cited

U.S. PATENT DOCUMENTS

| | | | |
|---|---|---|---|
| 2017/0336443 A1 | 11/2017 | Yokota et al. | |
| 2018/0164362 A1* | 6/2018 | Premerlani | G01R 31/007 |
| 2018/0328974 A1 | 11/2018 | Nikolic | |
| 2019/0004095 A1* | 1/2019 | Hayashi | G01R 15/185 |
| 2021/0130948 A1* | 5/2021 | Lam | B01L 1/025 |
| 2022/0084737 A1* | 3/2022 | Lai | H02M 1/0064 |
| 2023/0136151 A1 | 5/2023 | Cima | |
| 2024/0353492 A1* | 10/2024 | Kondo | G01R 31/34 |

FOREIGN PATENT DOCUMENTS

| | | |
|---|---|---|
| JP | 2000-131343 A | 5/2000 |
| JP | 2016-114558 A | 6/2016 |
| JP | 2019-12028 A | 1/2019 |
| WO | 2021/198590 A2 | 10/2021 |

OTHER PUBLICATIONS

Office Action dated Mar. 4, 2025, issued in counterpart EP Application No. 23184630.4. (5 pages).

* cited by examiner

CURRENT DETECTION APPARATUS

CROSS-REFERENCE TO RELATED APPLICATION

The present application claims priority to Japanese Patent Application No. 2022-111445 filed on Jul. 11, 2022, the entire contents of which are incorporated herein by reference.

TECHNICAL FIELD

The present disclosure relates to a current detection apparatus.

BACKGROUND

A current detection apparatus that includes an annular magnetic core, surrounding a conductor to be measured through which a current to be measured flows, and a feedback coil arranged to wind around the magnetic core is known.

In such a current detection apparatus, when a current flows in the conductor to be measured, a magnetic flux is generated in the magnetic core, and a current flows in the feedback coil to cancel this magnetic flux. The current detection apparatus can detect the current flowing in the conductor to be measured by detecting the current flowing in this feedback coil.

In the above-described current detection apparatus, it is usually assumed that the conductor to be measured passes through the center of the magnetic core, but the position of the conductor to be measured may shift from the center of the magnetic core. If the position of the conductor to be measured is shifted from the center of the magnetic core, varying current values may be detected even if the current flowing through the conductor to be measured is the same.

For example, if the feedback coil is located only in a portion of the magnetic core, a large current value is detected when the position of the conductor to be measured is close to the feedback coil, whereas a small current value is detected when the position of the conductor to be measured is far from the feedback coil.

In order to reduce such variation in the measured current value, a configuration in which the feedback coils are evenly arranged over the entire circumferential direction of the magnetic core is known. In this way, in a case in which the conductor to be measured is shifted from the center, the magnetic flux generated in the feedback coil that is closer to the conductor to be measured becomes larger, whereas the magnetic flux generated in the feedback coil located opposite to this feedback coil becomes smaller. The magnetic flux is thus averaged out overall, reducing the variation in the measured current value.

Even with the feedback coils evenly arranged over the entire circumferential direction of the magnetic core, however, if the loads on the feedback coils arranged at opposing positions differ in magnitude, the measured current value will end up varying when the current flowing in the conductor to be measured is a high frequency current, because the effect of the load cannot be ignored. The load on the feedback coil includes stray capacitance, DC resistance, inductance, and the like.

To address this issue, a known current detection apparatus includes feedback coils that are evenly arranged over the entire circumferential direction of the magnetic core, and the magnitudes of the loads on the feedback coils arranged at opposing positions are aligned insofar as possible. For example, see Patent Literature (PTL) 1.

CITATION LIST

Patent Literature

PTL 1: JP 2019-12028 A

SUMMARY

A current detection apparatus according to an embodiment includes an annular magnetic core that can be arranged to surround a conductor to be measured through which a current to be measured flows; a first coil group including a plurality of first coils arranged to wind around the magnetic core and connected in series; a second coil group including a plurality of second coils arranged to wind around the magnetic core and connected in series; and a detector configured to detect both a current flowing in the first coil group and a current flowing in the second coil group, wherein the first coil group and the second coil group are connected in parallel between a first node and a second node, a count of the plurality of first coils and a count of the plurality of second coils are identical, and a first coil, among the plurality of first coils, in $i^{th}$ place from the first node and a second coil, among the plurality of second coils, in $i^{th}$ place from the first node are arranged at opposing positions, where i is an integer.

A current detection apparatus according to an embodiment includes an annular magnetic core that can be arranged to surround a conductor to be measured through which a current to be measured flows, a first coil group including a plurality of first coils arranged to wind around the magnetic core and connected in series, a second coil group including a plurality of second coils arranged to wind around the magnetic core and connected in series, a first resistor through which flows a current flowing in the first coil group, a second resistor through which flows a current flowing in the second coil group, and a detector configured to detect a voltage at both ends of the first resistor and a voltage at both ends of the second resistor, wherein the first coil group and the second coil group are connected in parallel between a first node and a second node, a count of the plurality of first coils and a count of the plurality of second coils are identical, and a first coil, among the plurality of first coils, in $i^{th}$ place from the first node and a second coil, among the plurality of second coils, in $i^{th}$ place from the first node are arranged at opposing positions, where i is an integer.

DETAILED DESCRIPTION

Figure 1:
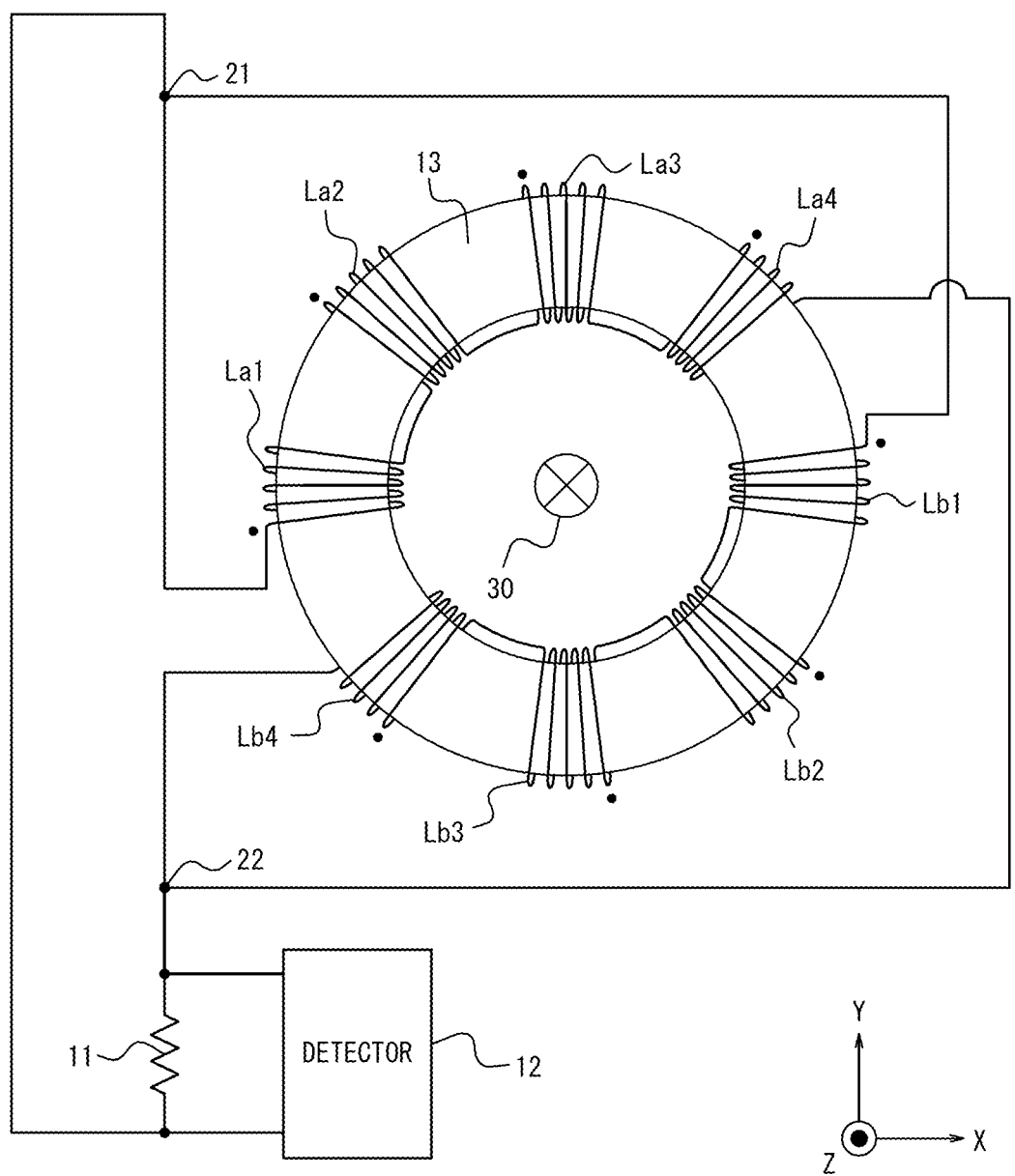
FIG. 1 is a diagram illustrating a schematic configuration of a current detection apparatus according to an embodiment.

In the current detection apparatus disclosed in PTL 1, unit windings (feedback coils) connected in series are evenly arranged over the entire circumferential direction of the magnetic core. Also, feedback coils at equivalent positions in terms of the electrical circuit are arranged at opposing positions and connected so that the loads of the feedback coils arranged at opposing positions are equivalent.

Since all of the feedback coils are connected in series in the current detection apparatus disclosed in PTL 1, the wiring to connect the feedback coils becomes complicated when implementing the equalization of the loads on the feedback coils arranged at opposing positions.

It would be helpful to provide a current detection apparatus that can reduce the variation in the measured current value according to the position of the conductor to be measured and that enables connection of the feedback coils with simple wiring.

A current detection apparatus according to an embodiment includes an annular magnetic core that can be arranged to surround a conductor to be measured through which a current to be measured flows; a first coil group including a plurality of first coils arranged to wind around the magnetic core and connected in series; a second coil group including a plurality of second coils arranged to wind around the magnetic core and connected in series; and a detector configured to detect both a current flowing in the first coil group and a current flowing in the second coil group, wherein the first coil group and the second coil group are connected in parallel between a first node and a second node, a count of the plurality of first coils and a count of the plurality of second coils are identical, and a first coil, among the plurality of first coils, in ich place from the first node and a second coil, among the plurality of second coils, in $i^{th}$ place from the first node are arranged at opposing positions, where i is an integer. According to this current detection apparatus, the variation in the measured current value according to the position of the conductor to be measured can be reduced, and the feedback coils can be connected with simple wiring.

The current detection apparatus according to an embodiment may further include a resistor through which flow both the current flowing in the first coil group and the current flowing in the second coil group, and the detector may be configured to detect a voltage at both ends of the resistor. Both the current flowing in the first coil group and the current flowing in the second coil group can thereby be detected with a simple configuration.

In the current detection apparatus according to an embodiment, the magnetic core may have a shape that is one of a circular ring shape, a ring shape with an elliptical cross-section, and a ring shape with a polygonal cross-section. The magnetic core can thus have various shapes.

The current detection apparatus according to an embodiment may further include a shield configured to house the first coil group and the second coil group. This can stabilize the value of stray capacitance.

The current detection apparatus according to an embodiment may further include a plurality of spacers installed between adjacent first coils and between adjacent second coils. This enables the spacing between adjacent first coils and adjacent second coils to be maintained at a fixed distance.

A current detection apparatus according to an embodiment includes an annular magnetic core that can be arranged to surround a conductor to be measured through which a current to be measured flows, a first coil group including a plurality of first coils arranged to wind around the magnetic core and connected in series, a second coil group including a plurality of second coils arranged to wind around the magnetic core and connected in series, a first resistor through which flows a current flowing in the first coil group, a second resistor through which flows a current flowing in the second coil group, and a detector configured to detect a voltage at both ends of the first resistor and a voltage at both ends of the second resistor, wherein the first coil group and the second coil group are connected in parallel between a first node and a second node, a count of the plurality of first coils and a count of the plurality of second coils are identical, and a first coil, among the plurality of first coils, in $i^{th}$ place from the first node and a second coil, among the plurality of second coils, in $i^{th}$ place from the first node are arranged at opposing positions, where i is an integer. According to this current detection apparatus, the variation in the measured current value according to the position of the conductor to be measured can be reduced, and the feedback coils can be connected with simple wiring.

According to the present disclosure, a current detection apparatus that can reduce the variation in the measured current value according to the position of the conductor to be measured and that enables connection of the feedback coils with simple wiring can be provided.

Embodiments of the present disclosure are now described with reference to the drawings.

FIG. 1 is a diagram illustrating a schematic configuration of a current detection apparatus 10 according to an embodiment. The current detection apparatus 10 includes a resistor 11, a detector 12, a magnetic core 13, a plurality of first coils La1 to La4, and a plurality of second coils Lb1 to Lb4.

The first coils La1 to La4 may be referred to simply as the "first coil La" when no distinction therebetween need be made. The second coils Lb1 to Lb4 may be referred to simply as the "second coil Lb" when no distinction therebetween need be made.

The current detection apparatus 10 detects the current flowing in the conductor to be measured 30. The conductor to be measured 30 is a linear conductor through which a current to be measured flows. In the example illustrated in FIG. 1, the current to be measured flows in the conductor to be measured 30 from the positive direction towards the negative direction of the Z-axis.

Figure 2:
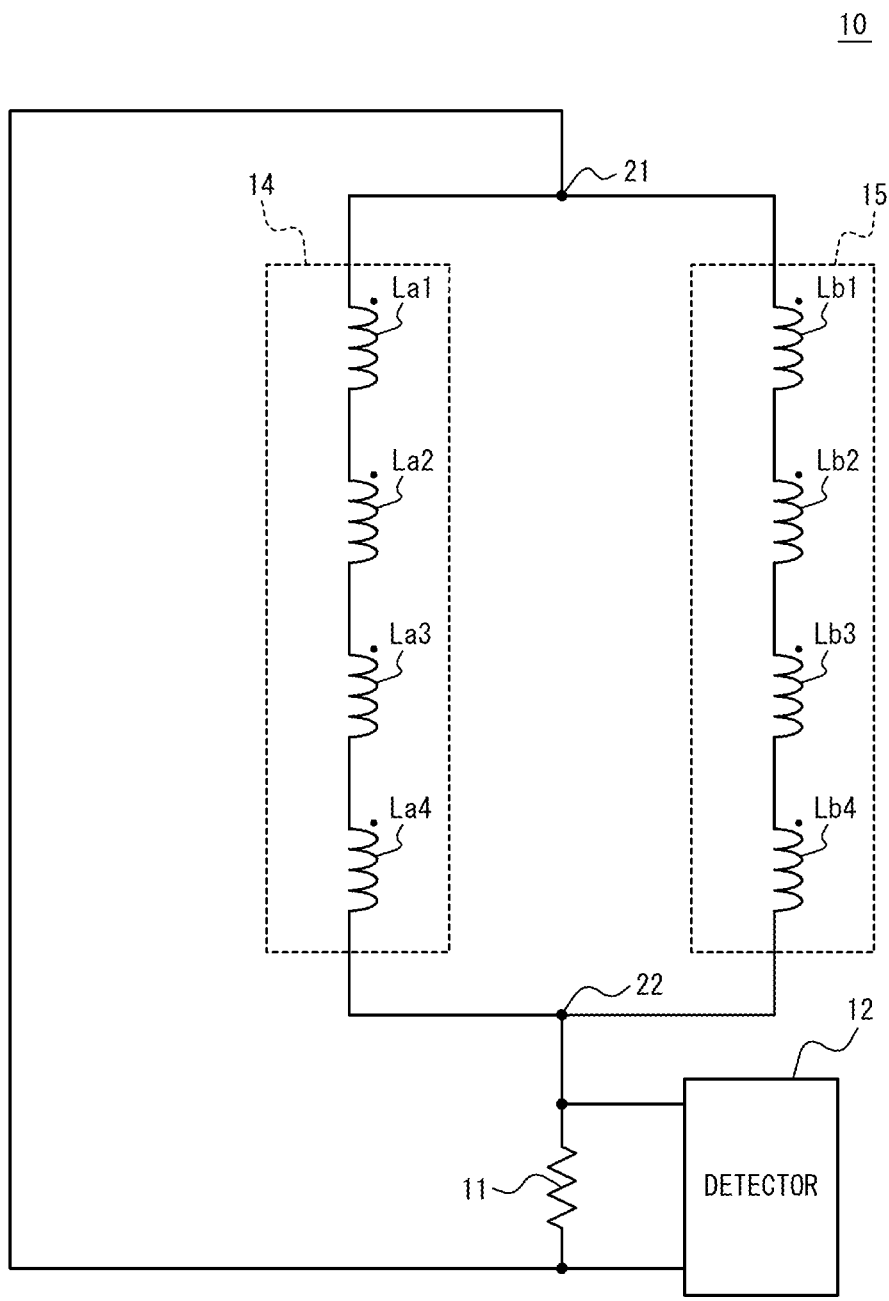
FIG. 2 is a diagram illustrating a circuit configuration of the current detection apparatus according to an embodiment.
Figure 3:
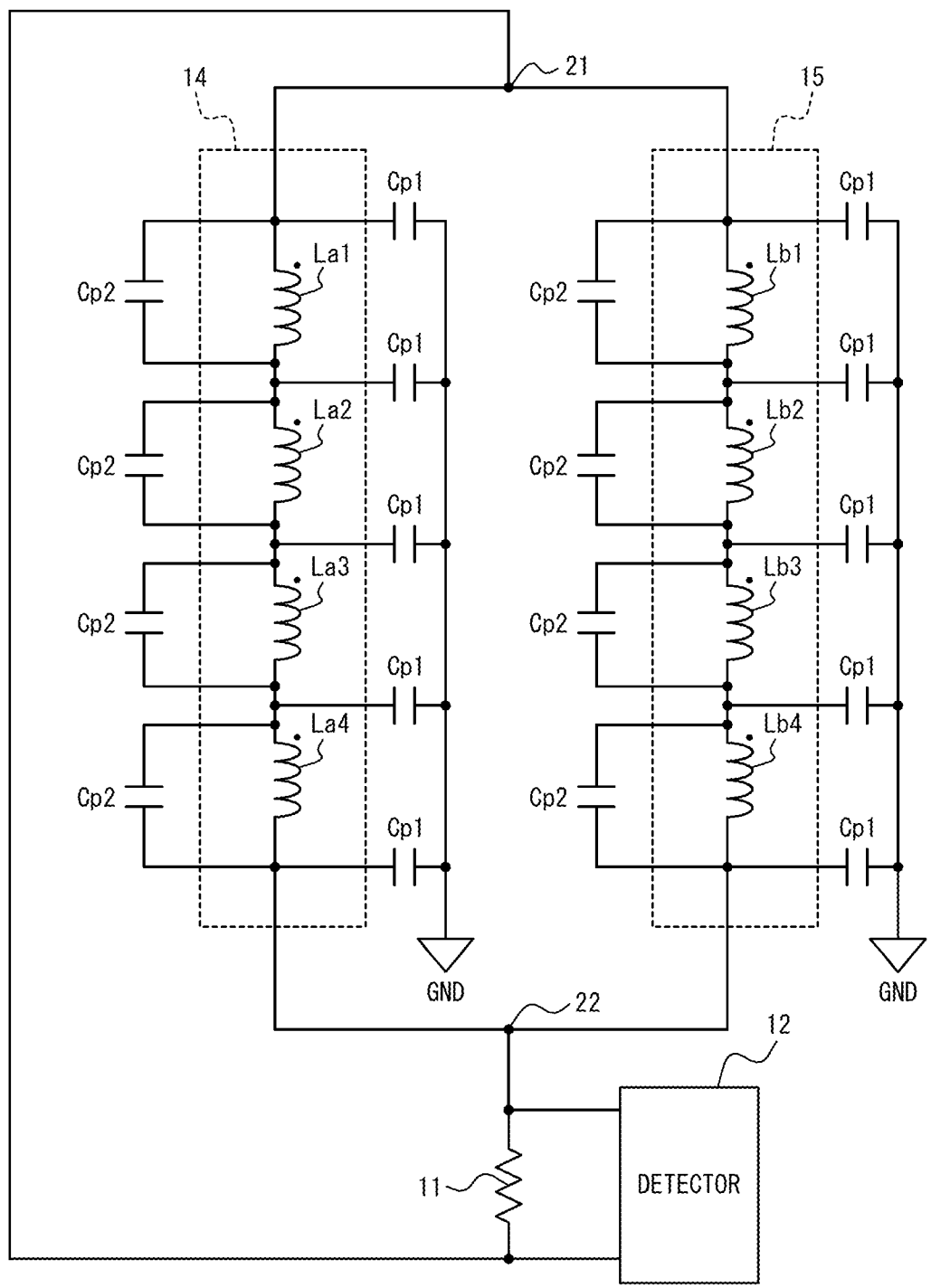
FIG. 3 is a diagram illustrating how stray capacitance is generated in the circuit configuration illustrated in FIG. 2.

FIG. 2 is a diagram illustrating a circuit configuration of the current detection apparatus 10 illustrated in FIG. 1. In FIG. 2, a depiction of the magnetic core 13 is omitted. FIG. 3 illustrates the stray capacitance generated in the first coils La1 to La4 and the stray capacitance generated in the second coils Lb1 to Lb4 in the circuit configuration of the current detection apparatus 10 illustrated in FIG. 2.

The configuration and functions of the current detection apparatus 10 are described with reference to FIGS. 1 to 3.

The magnetic core 13 can be arranged to surround the conductor to be measured 30. For example, if the conductor to be measured 30 passes near the center of the magnetic core 13, the magnetic core 13 can surround the conductor to be measured 30.

In the example illustrated in FIG. 1, the magnetic core 13 has a circular ring shape. The shape of the magnetic core 13 is not limited to a circular ring shape, however, and may be any other ring shape. For example, the magnetic core 13 may have a ring shape with an elliptical cross-section, a ring shape with a polygonal cross-section, or the like.

As illustrated in FIG. 1, the first coils La1 to La4 are each arranged to wind around the magnetic core 13. The first coils La1 to La4 are connected in series. The configuration of the first coils La1 to La4 connected in series as illustrated in FIG. 2 may be referred to hereinafter as the "first coil group 14". The first coils La1 to La4 function as feedback coils.

Although a configuration in which the first coil group 14 includes four first coils La1 to La4 is illustrated, the number of first coils La included in the first coil group 14 is not limited to four. The first coil group 14 may include two, three, or five or more first coils La. In the present embodiment, the case in which the first coil group 14 is configured to include the four first coils La1 to La4 is described as an example.

As illustrated in FIG. 1, the second coils Lb1 to Lb4 are each arranged to wind around the magnetic core 13. The second coils Lb1 to Lb4 are connected in series. The configuration of the second coils Lb1 to Lb4 connected in series as illustrated in FIG. 2 may be referred to hereinafter as the "second coil group 15". The second coils Lb1 to Lb4 function as feedback coils.

Although a configuration in which the second coil group 15 includes four second coils Lb1 to Lb4 is illustrated, the number of second coils Lb included in the second coil group 15 is not limited to four. The second coil group 15 may include two, three, or five or more first coils Lb. In the present embodiment, the case in which the second coil group 15 is configured to include the four second coils Lb1 to Lb4 is described as an example.

As illustrated in FIGS. 1 and 2, the first coil group 14 and the second coil group 15 are connected in parallel between the first node 21 and the second node 22. The count of the first coils La included in the first coil group 14 and the count of the second coils Lb included in the second coil group 15 are identical. In the present embodiment, the first coil group 14 includes four first coils La1 to La4, and the second coil group 15 includes four second coils Lb1 to Lb4.

As illustrated in FIG. 1, the first coils La1 to La4 and the second coils Lb1 to Lb4 are arranged at equal intervals along the magnetic core 13. In the present embodiment, the first coils La1 to La4 and the second coils Lb1 to Lb4 are arranged every 45 degrees along the magnetic core 13, since the total number of first coils La1 to La4 and second coils Lb1 to Lb4 is eight.

As illustrated in FIG. 1, the first coil La, among the first coils La1 to La4 of the first coil group 14, in $i^{th}$ place from the first node 21 and the second coil Lb, among the second coils Lb1 to Lb4 of the second coil group 15, in $i^{th}$ place from the first node 21 are arranged at opposing positions, where i is an integer.

For example, the first coil La1 is in first place from the first node 21. The second coil Lb1 is in first place from the first node 21. Referring to FIG. 1, the first coil La1 and the second coil Lb1 are arranged at opposing positions. Arranged at opposing positions refers to how the coils are arranged at 180 degree positions along the magnetic core 13.

The first coil La2 is in second place from the first node 21. The second coil Lb2 is in second place from the first node 21. Referring to FIG. 1, the first coil La2 and the second coil Lb2 are arranged at opposing positions. The first coil La3 and the second coil Lb3 are similarly arranged at opposing positions. The first coil La4 and the second coil Lb4 are similarly arranged at opposing positions.

The first coil La, among the first coils La1 to La4 of the first coil group 14, in $i^{th}$ place from the first node 21 and the second coil Lb, among the second coils Lb1 to Lb4 of the second coil group 15, in $i^{th}$ place from the first node 21 have equal inductor characteristics.

For example, the first coil La1 is in first place from the first node 21. The second coil Lb2 is in first place from the first node 21. Therefore, the first coil La1 and the second coil Lb1 have equal inductor characteristics. Similarly, the first coil La2 and the second coil Lb2 have equal inductor characteristics. The first coil La3 and the second coil Lb3 also have equal inductor characteristics. The first coil La4 and the second coil Lb4 also have equal inductor characteristics.

The first coils La1 to La4 and the second coils Lb1 to Lb4 may suitably all have equal inductor characteristics.

This arrangement enables the first coils La and the second coils Lb, which have equal appearance in terms of electrical load, to be arranged at opposing positions. The equal appearance in terms of electrical load is explained with reference to FIG. 3.

FIG. 3 is a diagram also illustrating the stray capacitance generated in the first coils La1 to La4 and the stray capacitance generated in the second coils Lb1 to Lb4. In FIG. 3, the stray capacitance Cp1 is the stray capacitance generated between the first coils La1 to La4 or the second coils Lb1 to Lb4 and ground. The stray capacitance Cp2 is the stray capacitance generated between the terminals in each of the first coils La1 to La4 and the second coils Lb1 to Lb4.

Referring to FIG. 3, the first coil La, among the first coils La1 to La4 of the first coil group 14, in $i^{th}$ place from the first node 21 and the second coil Lb, among the second coils Lb1 to Lb4 of the second coil group 15, in $i^{th}$ place from the first node 21 have equal appearance in terms of electrical load, even if the stray capacitance Cp1 and stray capacitance Cp2 are taken into account.

For example, the first coil La1 is in first place from the first node 21. The second coil Lb2 is in first place from the first node 21. Referring to FIG. 3, the appearance in terms of electrical load as seen from the first coil La1 and the appearance in terms of electrical load as seen from the second coil Lb1 are equal.

Similarly, the appearance in terms of electrical load as seen from the first coil La2 and the appearance in terms of electrical load as seen from the second coil Lb2 are equal. The appearance in terms of electrical load as seen from the first coil La3 and the appearance in terms of electrical load as seen from the second coil Lb3 are also equal. The appearance in terms of electrical load as seen from the first coil La4 and the appearance in terms of electrical load as seen from the second coil Lb4 are also equal.

In this way, the first coils La and the second coils Lb, which have equal appearance in terms of electrical load even when stray capacitance is taken into account, are arranged at opposing positions in the current detection apparatus 10. This enables the current detection apparatus 10 to detect, with small variation, the current flowing in the conductor to be measured 30 even when the current flowing in the conductor to be measured 30 is a high frequency current, and the position of the conductor to be measured 30 is shifted from the center of the magnetic core 13.

The resistor 11 is connected between the first node 21 and the second node 22. Both the current flowing in the first coil group 14 and the current flowing in the second coil group 15 flow in the resistor 11.

When a current flows in the conductor to be measured 30, a magnetic field is generated around the conductor to be measured 30. When the magnetic field is generated around the conductor to be measured 30, magnetic flux is generated inside the magnetic core 13.

When the magnetic flux is generated inside the magnetic core 13, a current flows in the first coil group 14 and the second coil group 15 to cancel this magnetic flux. The current flowing in the first coil group 14 and the second coil group 15 flows through the resistor 11.

The current flowing in the first coil group 14 and the second coil group 15 is proportional to the magnetic flux generated inside the magnetic core 13. The magnetic flux generated inside the magnetic core 13 is also proportional to the current flowing in the conductor to be measured 30. Therefore, the current flowing through the resistor 11 is proportional to the current flowing in the conductor to be measured 30.

In a case in which the conductor to be measured 30 is at the center of the magnetic core 13, the current flowing in the first coil group 14 and the current flowing in the second coil group 15 are equal.

Consider the case in which the position of the conductor to be measured 30 is shifted from the center of the magnetic core 13. For example, suppose that the conductor to be measured 30 is closer to the first coil La2. In this case, the current flowing in the first coil group 14 increases, and the current flowing in the second coil group 15 decreases. Since both the current flowing in the first coil group 14 and the current flowing in the second coil group 15 flow through the resistor 11, the larger current and the smaller current offset each other, and the current flowing through the resistor 11 is nearly the same as when the conductor to be measured 30 is at the center of the magnetic core 13.

The detector 12 detects the voltage at both ends of the resistor 11. Since the voltage at both ends of the resistor 11 is proportional to the current flowing through the resistor 11, the detector 12 can detect the current flowing through the conductor to be measured 30 by detecting the voltage at both ends of the resistor 11.

The detector 12 includes at least a voltage sensor. The detector 12 may further include an amplifier that amplifies the voltage. The detector 12 may further include an AD converter that converts the voltage detected as an analog signal to a digital signal. In this case, the detector 12 detects the voltage at both ends of the resistor 11 as a digital signal.

The current detection apparatus 10 may further include a shield that houses the first coil group 14 and the second coil group 15. The shield may, for example, be in the shape of a conductive box. By connecting the shield to ground, the value of the stray capacitance Cp1 illustrated in FIG. 3 can be stabilized.

The current detection apparatus 10 may further include a plurality of spacers installed between adjacent first coils La and between adjacent second coils Lb. By installation of the spacers, the spacing between adjacent first coils La and adjacent second coils Lb can be maintained at a fixed distance.

In this way, the current detection apparatus 10 can reduce the variation in the measured current value even when the position of the conductor to be measured 30 is shifted from the center, since the first coils La1 to La4 and the second coils Lb1 to Lb4 are evenly arranged along the magnetic core 13. Furthermore, because the first coils La and the second coils Lb, which have equal appearance in terms of electrical load, are arranged at opposing positions in the current detection apparatus 10, the variation in the measured current value can be reduced even when a high frequency current is flowing in the conductor to be measured 30.

The current detection apparatus 10 is configured so that the first coil group 14 and the second coil group 15 are connected in parallel, so that even if the first coils La and the second coils Lb, which have equal appearance in terms of electrical load, are arranged at opposing positions, the first coils La1 to La4 and the second coils Lb1 to Lb4 can be connected with simple wiring.

(Effect of Residual Magnetic Flux Reduction)

The current detection apparatus 10 according to the present embodiment also has the effect of being able to reduce the residual magnetic flux generated in the magnetic core 13. The effect of being able to reduce the residual magnetic flux is explained below.

First, as a configuration that generates a residual magnetic flux, consider the case of a configuration in which the coils are evenly arranged along the magnetic core 13, and the evenly arranged coils are all connected in series.

Even with this configuration, if the conductor to be measured 30 is located at the center of the magnetic core 13, the magnetic flux generated in the magnetic core 13 by the current flowing in the conductor to be measured 30 can be canceled by the current flowing in the evenly arranged coils.

In a case in which the conductor to be measured 30 is shifted from the center of the magnetic core 13, a strong magnetic flux is generated at the position of the magnetic core 13 to which the conductor to be measured 30 approaches, and a weak magnetic flux is generated at the position of the magnetic core 13 from which the conductor to be measured 30 moves away.

At this time, a current that acts to cancel the magnetic flux generated in the magnetic core 13 flows through the coils evenly arranged along the magnetic core 13, but because all the coils are connected in series, these coils generate an average magnetic field. In other words, the magnetic field generated by the coils evenly arranged along the magnetic core 13 is too weak to cancel the magnetic flux at the position of the magnetic core 13 to which the conductor to be measured 30 approaches, and is too strong to cancel the magnetic flux at the position of the magnetic core 13 from which the conductor to be measured 30 moves away.

As a result, residual magnetic flux is generated both at the position of the magnetic core 13 to which the conductor to be measured 30 approaches and at the position of the magnetic core 13 from which the conductor to be measured 30 moves away.

If the residual magnetic flux is large, the magnetic core 13 may reach magnetic saturation, and the sensitivity for detecting the current flowing in the conductor to be measured 30 may decrease. To prevent magnetic saturation from being reached, the magnetic core 13 could be increased in size, but this would increase the cost of the magnetic core 13.

By contrast, the current detection apparatus 10 according to the present embodiment has a configuration in which the first coil group 14 and the second coil group 15 are connected in parallel. In this case, if the conductor to be measured 30 approaches the first coil group 14, for example, the magnetic flux generated in the magnetic core 13 at the position where the first coil group 14 is located becomes stronger, but a larger current flows in the first coil group 14 to cancel this strong magnetic flux. Furthermore, the magnetic flux generated in the magnetic core 13 at the position where the second coil group 15 is located becomes weaker, but a smaller current flows in the second coil group 15 to cancel this weak magnetic flux.

The current detection apparatus 10 can thus reduce the residual magnetic flux, since currents of different magnitudes can flow independently in the first coil group 14 and the second coil group 15.

Also, because the residual magnetic flux can be reduced, the current detection apparatus 10 does not require a larger magnetic core 13 to prevent magnetic saturation. The current detection apparatus 10 can therefore reduce the cost of the magnetic core 13.

According to the current detection apparatus 10 of an embodiment as described above, the variation in the measured current value according to the position of the conductor to be measured 30 can be reduced, and the first coils La and the second coils Lb can be connected with simple wiring. In greater detail, the current detection apparatus 10 includes the first coil group 14 and the second coil group 15, and the first coil La, among the first coils La1 to La4 of the first coil group 14, in $i^{th}$ place from the first node 21 and the second coil Lb, among the second coils Lb1 to Lb4 of the second coil group 15, in $i^{th}$ place from the first node 21 are arranged at opposing positions. The variation in the measured current value according to the position of the conductor to be measured 30 can therefore be reduced. Furthermore, since the first coil group 14 and the second coil group 15 are connected in parallel between the first node 21 and the second node 22, the first coils La and the second coils Lb can be connected with simple wiring.

(First Variation)

Figure 4:
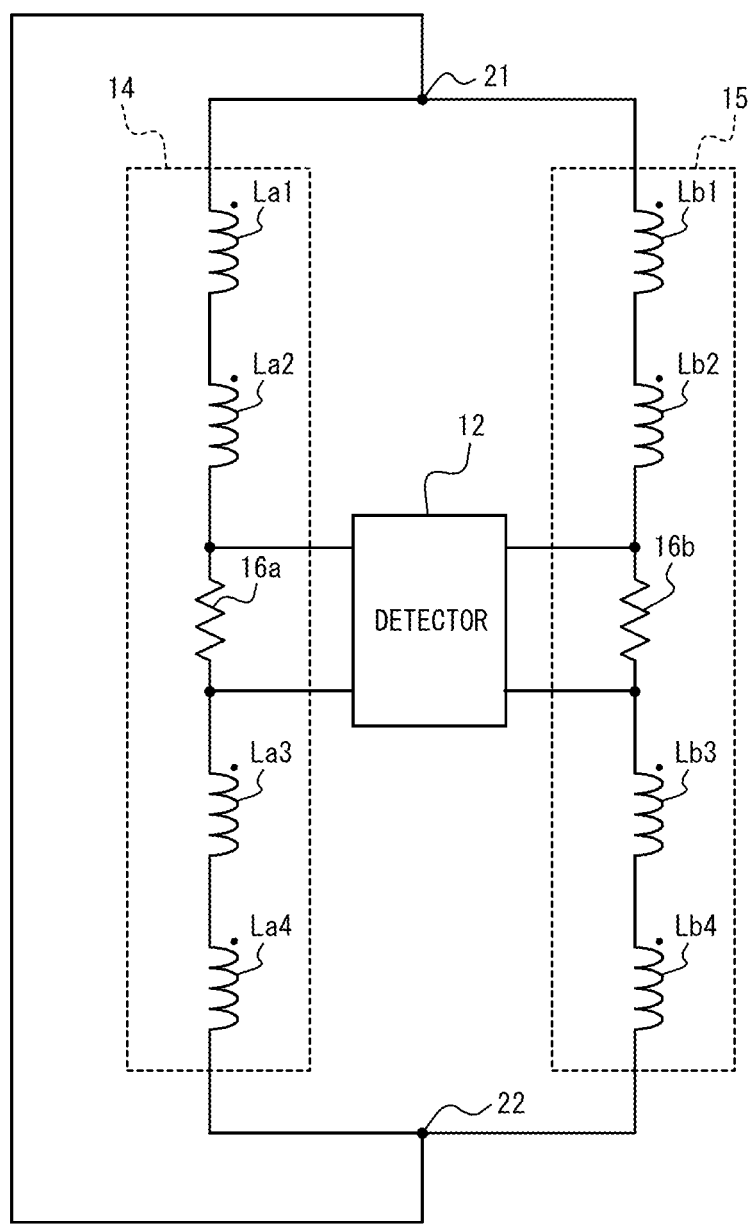
FIG. 4 is a diagram illustrating a circuit configuration of a current detection apparatus according to a first variation.

The current detection apparatus 10 illustrated in FIG. 1 includes the resistor 11 between the first node 21 and the second node 22, but the position and number of resistors 11 are not limited to this configuration. FIG. 4 illustrates a current detection apparatus 10a, according to a first variation, in which the position and number of resistors 11 differ.

The differences between the current detection apparatus 10a according to the first variation and the current detection apparatus 10 illustrated in FIG. 1 will mainly be explained, whereas an explanation of the common and similar points to the current detection apparatus 10 illustrated in FIG. 1 will be omitted.

The current detection apparatus 10a according to the first variation includes a first resistor 16a between the first coil La2 and the first coil La3 in the first coil group 14. The current detection apparatus 10a according to the first variation also includes a second resistor 16b between the second coil Lb2 and the second coil Lb3 in the second coil group 15.

Connection of the first resistor 16a between the first coil La2 and the first coil La3 is only one example, and the first resistor 16a may be connected between other adjacent first coils La. Connection of the second resistor 16b between the second coil Lb2 and the second coil Lb3 is also only one example, and the second resistor 16b may be connected between other adjacent second coils Lb.

The first resistor 16a and the second resistor 16b may have the same resistance or different resistances. Since the first resistor 16a and the second resistor 16b may have different resistances, each can be adjusted to the optimum resistance.

The current flowing in the first coil group 14 flows through the first resistor 16a. The current flowing in the second coil group 15 flows through the second resistor 16b.

The detector 12 detects the voltage at both ends of the first resistor 16a and the voltage at both ends of the second resistor 16b. The detector 12 can detect the current flowing in the conductor to be measured 30 based on the value yielded by adding the voltage at both ends of the first resistor 16a and the voltage at both ends of the second resistor 16b.

The detector 12 can also detect the current flowing in the first coil group 14 based on the voltage at both ends of the first resistor 16a. The detector 12 can detect the current flowing in the second coil group 15 based on the voltage at both ends of the second resistor 16b. The detector 12 can estimate the position of the conductor to be measured 30 by comparing the current flowing in the first coil group 14 and the current flowing in the second coil group 15. For example, when the conductor to be measured 30 is centered, the current flows equally in the first coil group 14 and the second coil group 15. When the conductor to be measured 30 is close to the first coil group 14, for example, a larger current flows in the first coil group 14 and a smaller current flows in the second coil group 15. When the conductor to be measured 30 is close to the second coil group 15, for example, a larger current flows in the second coil group 15 and a smaller current flows in the first coil group 14. In this way, the detector 12 can estimate the position of the conductor to be measured 30 by comparing the current flowing in the first coil group 14 and the current flowing in the second coil group 15.

For example, in a case in which the current flowing in the first coil group 14 and the current flowing in the second coil group 15 are equal, the detector 12 estimates that the conductor to be measured 30 is located near the center of the magnetic core 13. In a case in which the current flowing in the first coil group 14 is greater than the current flowing in the second coil group 15, the detector 12 estimates that the conductor to be measured 30 is closer to the first coil group 14. In a case in which the current flowing in the second coil group 15 is greater than the current flowing in the first coil group 14, the detector 12 estimates that the conductor to be measured 30 is closer to the second coil group 15.

(Second Variation)

Figure 5:
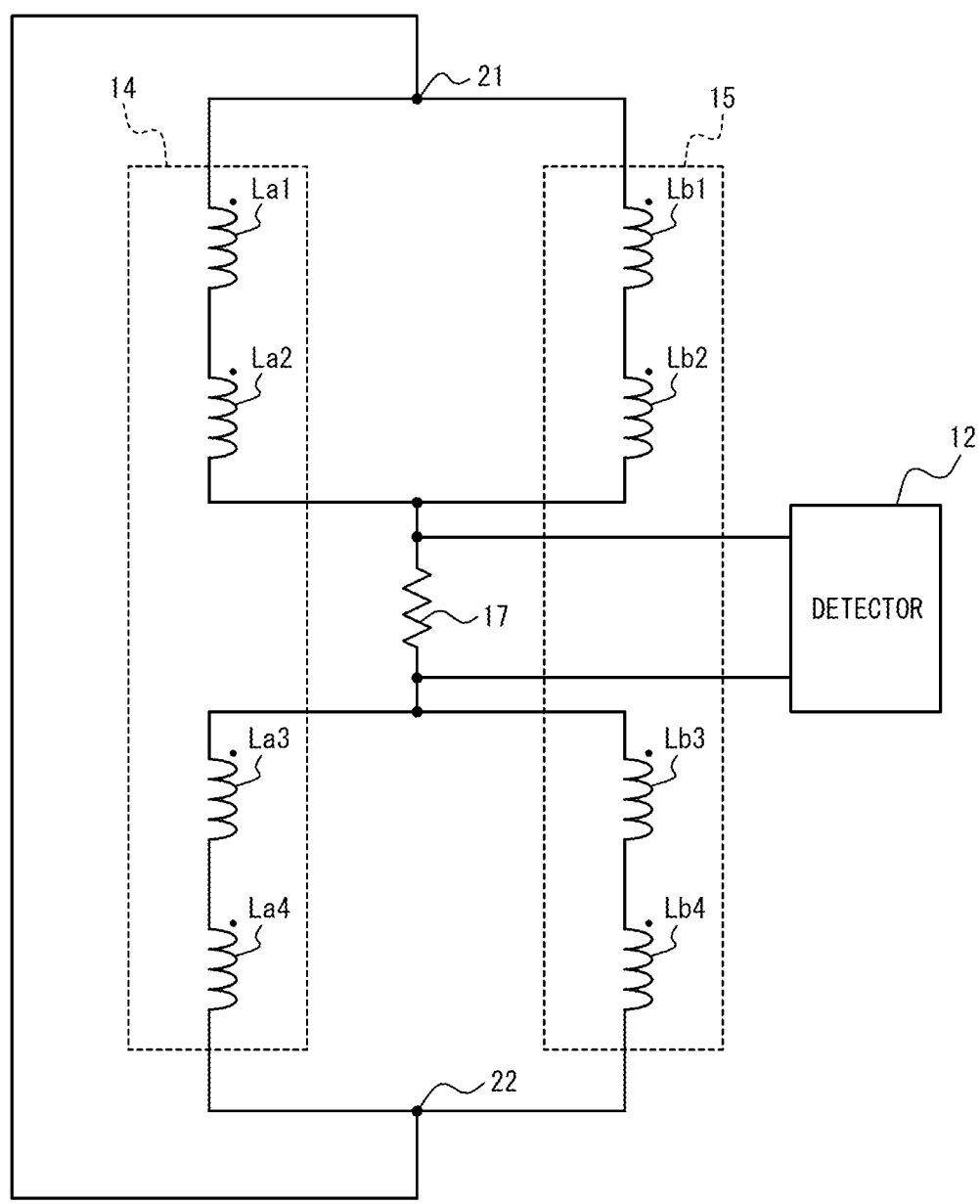
FIG. 5 is a diagram illustrating a circuit configuration of a current detection apparatus according to a second variation.

FIG. 5 illustrates a current detection apparatus 10b, according to a second variation, in which the position of the resistor 11 differs. The differences between the current detection apparatus 10b according to the second variation and the current detection apparatus 10 illustrated in FIG. 1 will mainly be explained, whereas an explanation of the common and similar points to the current detection apparatus 10 illustrated in FIG. 1 will be omitted.

The current detection apparatus 10b according to the second variation includes a resistor 17 between a node connecting the first coil La2 and the second coil Lb2 and a node connecting the first coil La3 and the second coil Lb3.

Note that the position of the resistor 17 illustrated in FIG. 5 is only an example. The resistor 17 may be located between a node connecting the first coil La1 and the second coil Lb1 and a node connecting the first coil La2 and the second coil Lb2, or between a node connecting the first coil La3 and the second coil Lb3 and a node connecting the first coil La4 and the second coil Lb4.

The detector 12 detects the voltage at both ends of the resistor 17. The detector 12 can detect the current flowing through the conductor to be measured 30 by detecting the voltage at both ends of the resistor 17.

In this way, the current detection apparatus 10b according to the second variation includes the resistor 17 at a different position than the current detection apparatus 10 illustrated in FIG. 1 but can detect the current flowing in the conductor to be measured 30 in the same way as the current detection apparatus 10 illustrated in FIG. 1.

It will be clear to a person of ordinary skill in the art that the present disclosure may be implemented in certain ways other than the above embodiments without departing from the spirit or essential features thereof. Accordingly, the above explanation merely provides examples that are in no way limiting. The scope of the present disclosure is to be defined by the appended claims, not by the above explanation. Among all changes, various changes that are within the range of equivalents are included therein.

For example, the arrangement, number, and the like of the above-described components are not limited to the above explanation or the drawings. The arrangement, number, and the like of each component may be selected freely as long as the functions of the component can be achieved.

For example, in the above embodiment, the case in which the detector 12 detects both the current flowing in the first coil group 14 and the current flowing in the second coil group 15 by detecting the voltage at both ends of the resistor 11 has been illustrated, but the means by which the detector 12 detects both the current flowing in the first coil group 14 and the current flowing in the second coil group 15 is not limited to this example. The detector 12 may use any current sensor to detect both the current flowing in the first coil group 14 and the current flowing in the second coil group 15. For example, the detector 12 may use a non-contact current sensor to detect both the current flowing in the first coil group 14 and the current flowing in the second coil group 15.

For example, in the above embodiment, a configuration in which the first coil group 14 and the second coil group 15 are connected in parallel has been illustrated, but the number of coil groups connected in parallel is not limited to two. Three or more coil groups may be connected in parallel.

The invention claimed is:

1. A current detection apparatus comprising:
an annular magnetic core that can be arranged to surround a conductor to be measured through which a current to be measured flows;
a first coil group comprising a plurality of first coils different from each other, equally spaced from each other, arranged to wind around the magnetic core and connected in series;
a second coil group comprising a plurality of second coils different from each other, equally spaced from each other, arranged to wind around the magnetic core and connected in series; and
a detector configured to detect both a current flowing in the first coil group and a current flowing in the second coil group, wherein
the first coil group and the second coil group are connected in parallel between a first node and a second node,
a count of the plurality of first coils and a count of the plurality of second coils are identical, and
a first coil, among the plurality of first coils, in $i^{th}$ place from the first node and a second coil, among the plurality of second coils, in $i^{th}$ place from the first node are arranged at opposing positions, where i is an integer.

2. The current detection apparatus according to claim 1, further comprising a resistor through which flow both the current flowing in the first coil group and the current flowing in the second coil group, wherein the detector is configured to detect a voltage at both ends of the resistor.

3. The current detection apparatus according to claim 1, wherein the magnetic core has a shape that is one of a circular ring shape, a ring shape with an elliptical cross-section, and a ring shape with a polygonal cross-section.

4. The current detection apparatus according to claim 1, further comprising a shield configured to house the first coil group and the second coil group.

5. The current detection apparatus according to claim 1, further comprising a plurality of spacers installed between adjacent first coils and between adjacent second coils.

6. The current detection apparatus according to claim 1, wherein the detector is configured to compare the current flowing in the first coil group and the current flowing in the second coil group and estimate a position of the current to be measured.

7. A current detection apparatus comprising:
an annular magnetic core that can be arranged to surround a conductor to be measured through which a current to be measured flows;
a first coil group comprising a plurality of first coils different from each other, equally spaced from each other, arranged to wind around the magnetic core and connected in series;
a second coil group comprising a plurality of second coils different from each other, equally spaced from each other, arranged to wind around the magnetic core and connected in series;
a first resistor through which flows a current flowing in the first coil group;
a second resistor through which flows a current flowing in the second coil group; and
a detector configured to detect a voltage at both ends of the first resistor and a voltage at both ends of the second resistor, wherein
the first coil group and the second coil group are connected in parallel between a first node and a second node,
a count of the plurality of first coils and a count of the plurality of second coils are identical, and
a first coil, among the plurality of first coils, in $i^{th}$ place from the first node and a second coil, among the plurality of second coils, in $i^{th}$ place from the first node are arranged at opposing positions, where i is an integer.

8. The current detection apparatus according to claim 7, wherein the detector is configured to compare the current flowing in the first coil group and the current flowing in the second coil group and estimate a position of the current to be measured.

* * * * *